United States Patent [19]

Starr

[11] Patent Number: 4,514,845
[45] Date of Patent: Apr. 30, 1985

[54] METHOD AND APPARATUS FOR BUS FAULT LOCATION

[75] Inventor: Thomas J. J. Starr, Wheaton, Ill.

[73] Assignee: AT&T Bell Laboratories, Murray Hill, N.J.

[21] Appl. No.: 410,269

[22] Filed: Aug. 23, 1982

[51] Int. Cl.³ .................. G06F 11/26; G06F 11/22
[52] U.S. Cl. .................... 371/15; 364/900; 371/22
[58] Field of Search .............. 371/15, 16, 25, 22; 364/200 MS File, 900 MS File; 324/51, 52

[56] References Cited

U.S. PATENT DOCUMENTS

| Re. 27,580 | 2/1973 | Rawson et al. | 340/172.5 |
|---|---|---|---|
| 3,599,179 | 8/1971 | Arnold | 371/25 X |
| 4,100,605 | 7/1978 | Holman | 364/900 |
| 4,122,358 | 10/1978 | Altmann | 371/22 X |
| 4,371,952 | 2/1983 | Schuck | 364/900 |

FOREIGN PATENT DOCUMENTS 0042194 12/1981 European Pat. Off. .
1310664 3/1973 United Kingdom .

*Primary Examiner*—Jerry Smith
*Assistant Examiner*—Mark Ungerman
*Attorney, Agent, or Firm*—Kenneth H. Samples; Ross T. Watland

[57] ABSTRACT

A bus fault location arrangement for locating the source of a fault condition on a bus connecting a plurality of devices energized by a power supply. When such a fault condition is detected, a bus diagnostic unit included in the arrangement transmits a signal to place a given one of the plurality of devices in a high impedance state. The bus diagnostic unit then transmits a given signal level on the bus. To determine whether the given device is the source of the fault condition, current flow between the device and the power supply is sensed and an error signal is stored when the sensed current exceeds a predetermined magnitude.

15 Claims, 5 Drawing Figures

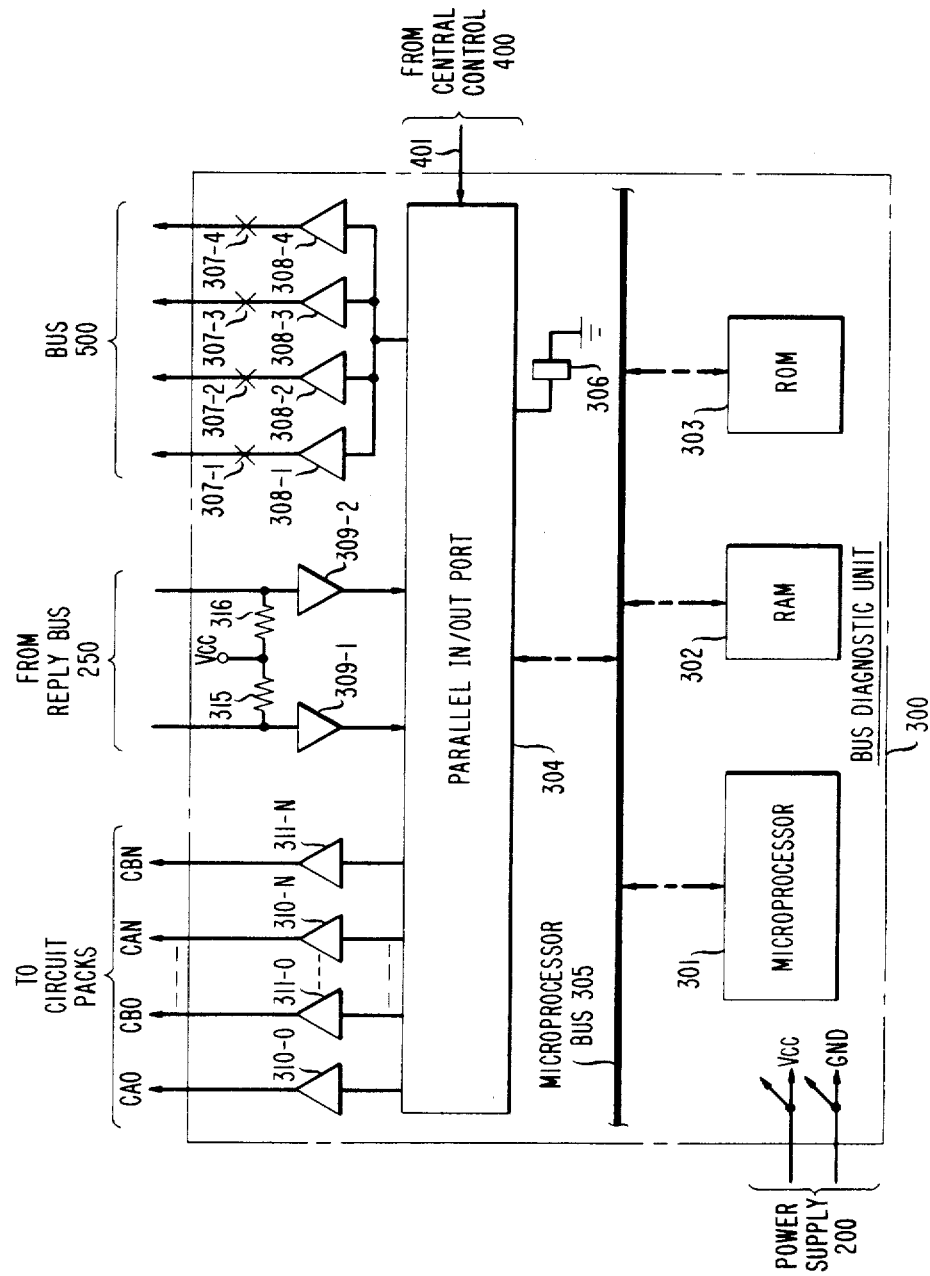
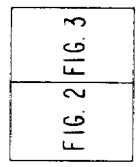

METHOD AND APPARATUS FOR BUS FAULT LOCATION

TECHNICAL FIELD

This invention relates to bus fault location and, more particularly, to a method and apparatus for bus fault location for use when a bus connecting a plurality of devices becomes locked at one logic state.

BACKGROUND OF THE INVENTION

Computer systems frequently include a number of circuit packs which are directly coupled to a shared bus. Each circuit pack interfaces to the bus via one or more devices, which, depending on the functions to be performed on that circuit pack, may be transmitters, receivers or transceivers. If one of the devices fails due to a shorted semiconductor junction, for example, the bus or a portion thereof can become locked at either logic zero or logic one due to the resulting low impedance path to the voltage source used to energize the circuit pack. Although detecting a bus fault of this type is relatively easy, isolating the failure to a particular circuit pack is more difficult, frequently being done by manually replacing one circuit pack at a time. The present invention is a method and apparatus for automatically locating the source of such bus faults.

SUMMARY OF THE INVENTION

A bus fault location arrangement in accordance with the present invention includes a bus, a number of devices connected to the bus and a power supply to energize the devices. A signal is transmitted to place a given device in a high impedance state and a predetermined signal level is transmitted on the bus. Current flow between the given device and the power supply is sensed and an error signal is generated when the sensed current exceeds a predetermined magnitude.

BRIEF DESCRIPTION OF THE DRAWING

A more complete understanding of the present invention may be obtained from a consideration of the following description when read in conjunction with the drawing in which:

FIG. 4 is a detailed diagram of a bus diagnostic unit included in the system of FIG. 1.

GENERAL DESCRIPTION

Figure 1:
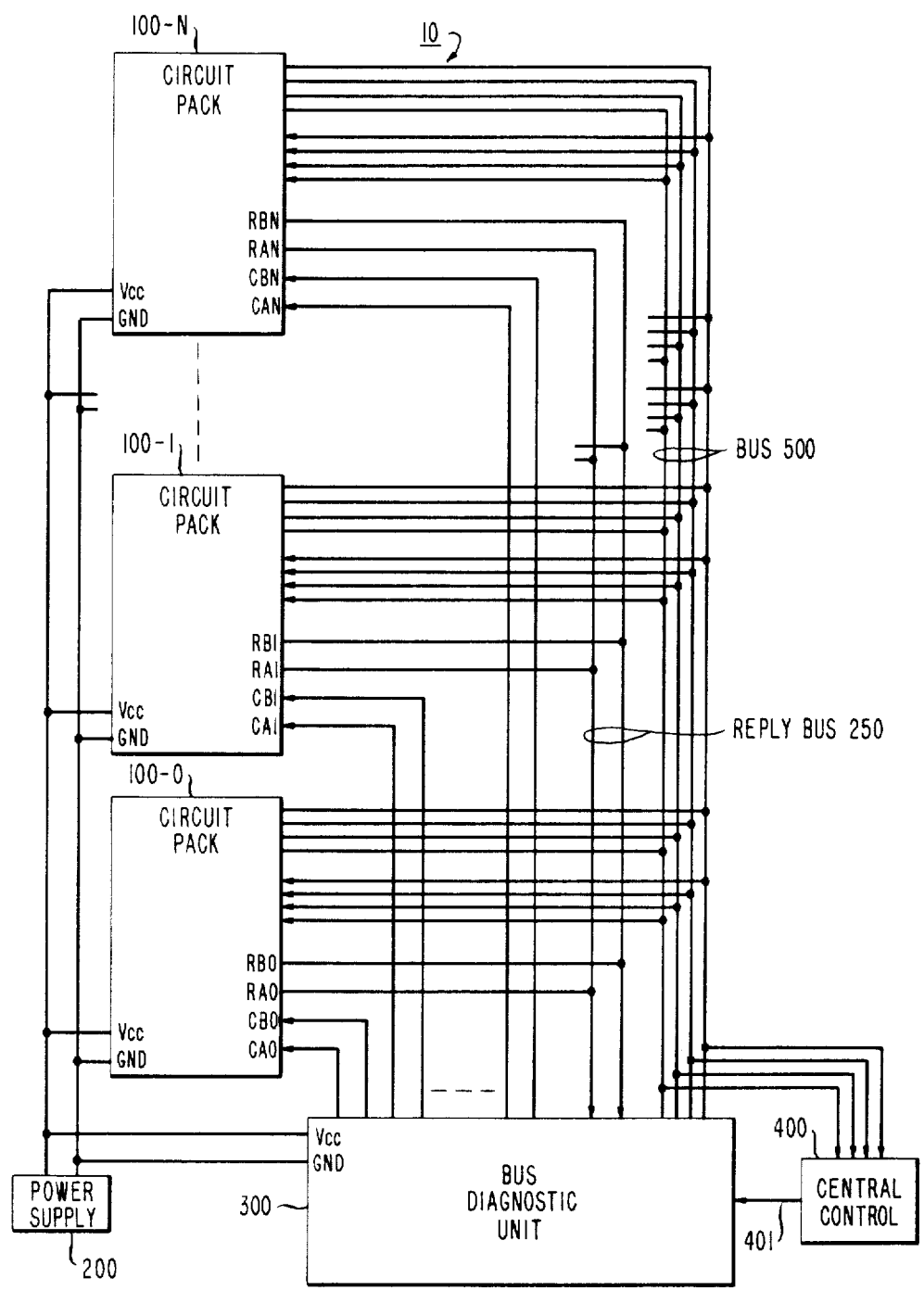
FIG. 1 is a block diagram of an illustrative system in accordance with the present invention.
Figure 2:
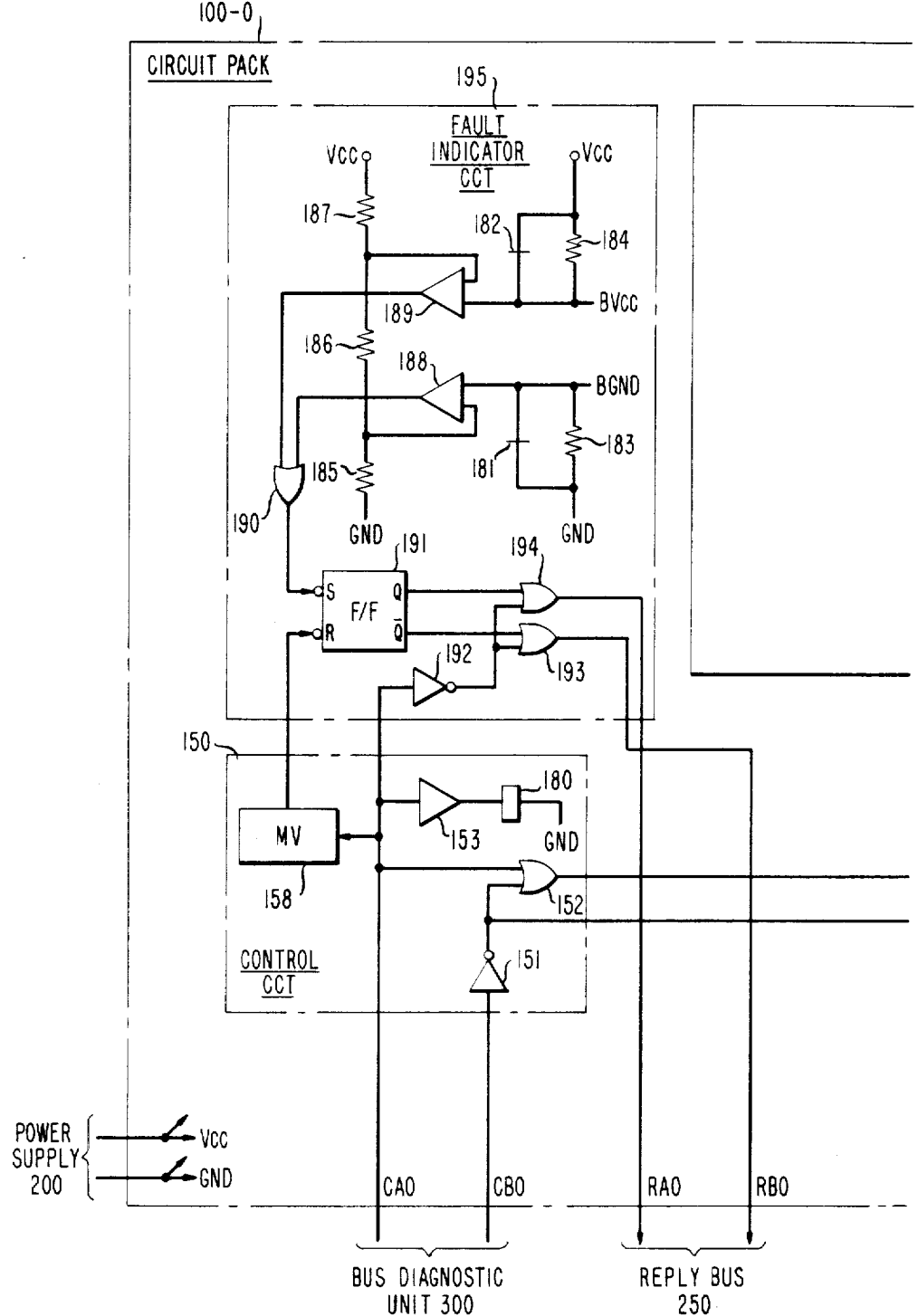
FIGS. 2 and 3, when arranged in accordance with FIG. 5, present a detailed diagram of a circuit pack included in the system of FIG. 1.
Figure 3:
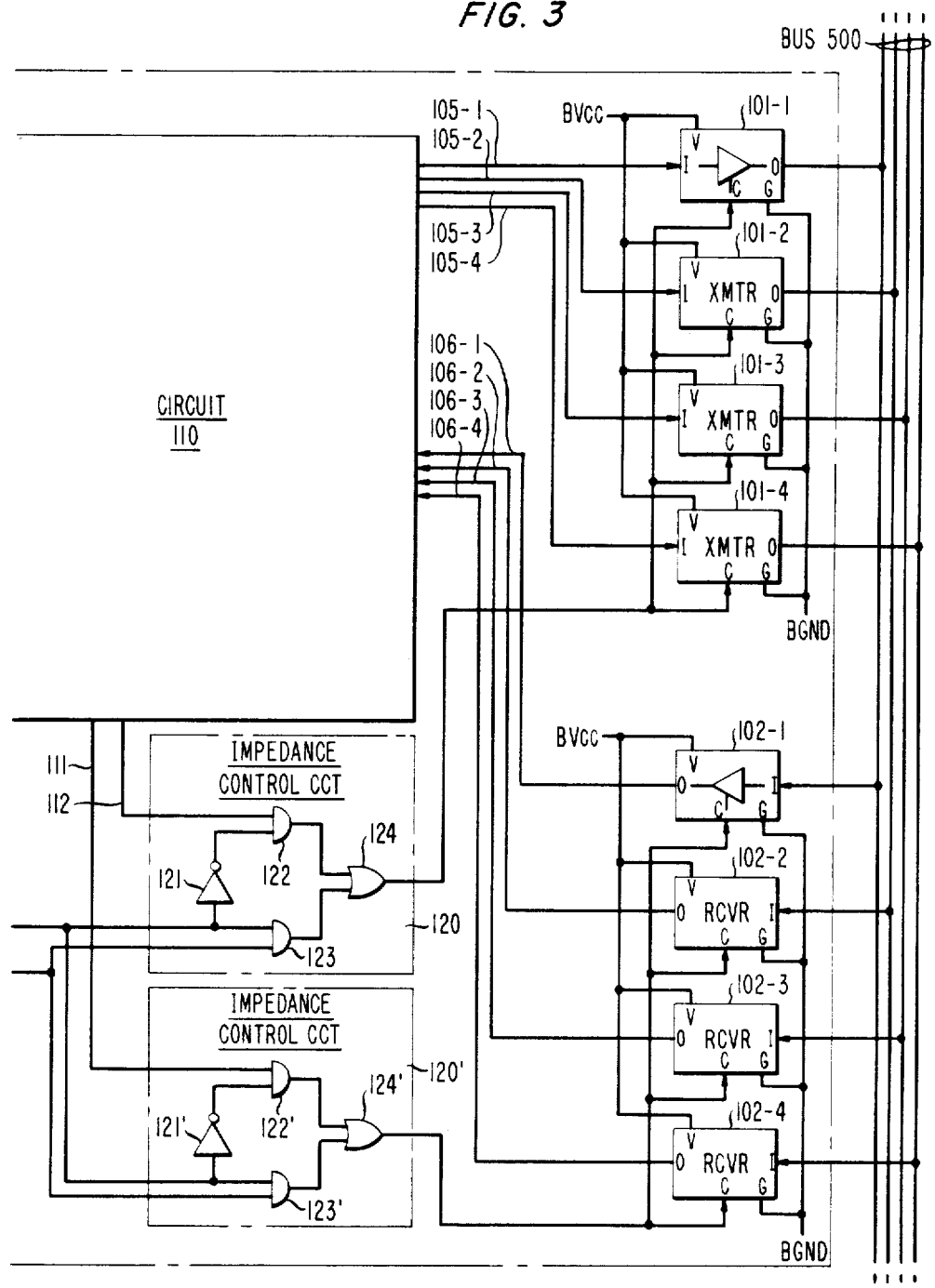

FIG. 1 is a block diagram of a system 10 which incorporates an exemplary embodiment of a bus fault location arrangement in accordance with the principles of the present invention. In system 10, a plurality of circuit packs 100-0, 100-1 . . . 100-N intercommunicate via a shared four-conductor bus 500. Each of the circuit packs 100-0, 100-1 . . . 100-N is energized by a power supply 200 and includes four transmitters and four receivers directly connected to bus 500. For example, circuit pack 100-0 (FIGS. 2 and 3 arranged in accordance with FIG. 5) has transmitters 101-1, 101-2, 101-3 and 101-4 and receivers 102-1, 102-2, 102-3, and 102-4. In the present example, the transmitters and receivers are CMOS integrated circuit tri-state devices such as National Semiconductor type MM70C95. In FIG. 3, the power-applying terminals of each of the tri-state devices are designated V and G and the input and output terminals are designated I and O, respectively. A terminal designated C is referred to herein as an impedance control terminal. A tri-state device can be placed in a high impedance state such that it does not interfere with another device transmitting data on bus 500 by applying a logic one signal to terminal C. In order that current flow between power supply 200 and the tri-state devices on a given circuit pack can be sensed, the power-applying terminals of the tri-state devices of the pack are interconnected via a pair of terminals BVCC and BGND (FIG. 3). A resistor 184 (FIG. 2) and a normally-closed relay contact 182 are connected in parallel between terminal BVCC and power supply 200 terminal VCC. Similarly, a resistor 183 and a normally-closed relay contact 181 are connected in parallel between terminal BGND and power supply 200 terminal GND. Both relay contacts 182 and 181 are controlled by a single relay input circuit 180. Resistors 184 and 183 are used respectively to sense current flow between BVCC and VCC and to sense current flow between BGND and GND when voltage is applied to relay input circuit 180 and relay contacts 181 and 182 are thereby opened.

In accordance with the present example, data are transmitted on bus 500 (FIG. 1) in four-bit nibbles each including a parity bit conveyed on one conductor of bus 500. A central control 400 monitors all data transmitted on bus 500 to detect parity errors. When central control 400 determines based on detected parity errors that a fault condition exists on bus 500, it transmits a signal, referred to as a fault signal, to a bus diagnostic unit 300 via a conductor 401. In response, bus diagnostic unit 300 transmits logic zero signals to input terminals CB0, CB1 . . . CBN on circuit packs 100-0, 100-1 . . . 100-N to place each of the transmitters and receivers of circuit packs 100-0, 100-1 . . . 100-N in their high impedance state. To determine if the source of the bus fault condition is a low impedance path between one or more of the conductors of bus 500 and one of the terminals BVCC and BGND of circuit pack 100-0 (FIGS. 2 and 3 arranged in accordance with FIG. 5), a logic one signal is transmitted to pack 100-0 input terminal CA0, which signal is applied to relay input circuit 180 via a relay driver 153. Accordingly, relay contacts 181 and 182 are opened. Bus diagnostic unit 300 (FIG. 1) then transmits first a logic one signal and then a logic zero signal on all four conductors of bus 500. If a low impedance path exists between bus 500 and BGND on pack 100-0, more than a predetermined magnitude of current will be sensed by resistor 183 when bus diagnostic unit 300 transmits a logic one signal on bus 500. Similarly, if a low impedance path exists between bus 500 and BVCC on pack 100-0, more than a predetermined magnitude of current will be sensed by resistor 184 when bus diagnostic unit 300 transmits a logic zero signal on bus 500. If either condition exists, pack 100-0 transmits a logic one signal from an output terminal RA0 to bus diagnostic unit 300 via a reply bus 250. To improve reliability, a logic zero signal is also transmitted from an output terminal RB0 to bus diagnostic unit 300 via reply bus 250. In response to these signals, bus diagnostic unit 300 determines that pack 100-0 is the source of the bus fault and this information is relayed by means not shown to a technician who will replace pack 100-0 or, in a duplicated system to a central control which will activate a duplicate pack. This process is repeated for packs 100-0 through 100-N until the source of the bus fault condition is located.

DETAILED DESCRIPTION

System 10 operates in three modes referred to herein as NORMAL, DIAGNOSTIC, and CURRENT SENSE TEST modes. In the NORMAL mode, packs 100-0, 100-1 . . . 100-N intercommunicate via bus 500 to perform system functions. System 10 is operated in the DIAGNOSTIC mode to locate the source of a fault condition on bus 500 in the manner previously described. Finally, system 10 is operated in the CURRENT SENSE TEST mode in a manner to be described herein to verify the proper operation of circuitry used in the DIAGNOSTIC mode. In circuit pack 100-0 (FIGS. 2 and 3 arranged in accordance with FIG. 5), control circuit 150, impedance control circuits 120 and 120', and fault indicator circuit 195 represent circuitry which is added to pack 100-0 to achieve the bus fault location capability of the present invention. The circuitry which allows circuit pack 100-0 to perform system functions in the NORMAL mode is represented by circuit 110, which is connected to the I input terminals of transmitters 101-1, 101-2, 101-3, and 101-4 via conductors 105-1, 105-2, 105-3, and 105-4 and to the 0 output terminals of receivers 102-1, 102-2, 102-3, and 102-4 via conductors 106-1, 106-2, 106-3, and 106-4. Circuit 110 could be, for example, a microcomputer or a microcomputer peripheral. If the bus fault location arrangement of the present invention were not incorporated in system 10, circuit pack 100-0 would include only circuit 110, transmitters 101-1, 101-2, 101-3, and 101-4 and receivers 102-1, 102-2, 102-3, and 102-4 and circuit 110 would directly control the impedance state of these transmitters and receivers via conductors 111 and 112. Since the portions of circuit packs 100-0, 100-1 . . . 100-N relevant to the present invention are substantially identical, only pack 100-0 is described in detail herein.

The establishment of the NORMAL, DIAGNOSTIC, or CURRENT SENSE TEST mode of operation is controlled by bus diagnostic unit 300 (FIG. 4), which comprises a microprocessor 301 (e.g., an Intel 8085), a random access memory 302, a read only memory 303, and a parallel in/out port 304 (e.g., an Intel 8255) interconnected by a microprocessor bus 305. Memory 303 stores the program defining the operation of bus diagnostic unit 300 and memory 302 is a scratch-pad memory necessary to the operation of microprocessor 301. Parallel in/out port 304 receives on conductor 401 the fault signal indicating the detection of a fault condition on bus 500 by central control 400. Microprocessor 301 controls system operation by effecting the transmission of control signals by parallel in/out port 304 via buffers 310-0 through 310-N and 311-0 through 311-N to associated input terminals CA0 through CAN and CB0 through CBN of circuit packs 100-0 through 100-N. Microprocessor 301 also controls the transmission of signals by parallel in/out port 304 to bus 500 via buffers 308-1, 308-2, 308-3, and 308-4 and normally-open relay contacts 307-1, 307-2, 307-3, and 307-4, which contacts isolate bus diagnostic unit 300 from bus 500 until being closed in response to the application of voltage to a relay input circuit 306 by parallel in/out port 304. Parallel in/out port 304 receives the signals indicating the result of fault location diagnostics from circuit packs 100-0 through 100-N via reply bus 250 and buffers 309-1 and 309-2. Two pull-up resistors 315 and 316 are connected between the conductors of reply bus 250 and the VCC terminal of power supply 200 to allow the proper operation of reply bus 250 with open-collector gates.

Bus diagnostic unit 300 maintains the NORMAL mode of system operation by transmitting logic zero signals to circuit pack input terminals CA0 through CAN and by transmitting logic one signals to circuit pack input terminals CB0 through CBN. In circuit pack 100-0 (FIGS. 2 and 3 arranged in accordance with FIG. 5), the logic zero signal received at terminal CA0 and the logic one signal received at terminal CB0 result in the transmission of logic zero signals by an inverter 151 and an OR gate 152 of control circuit 150 to impedance control circuits 120 and 120'. Impedance control circuit 120 comprises an inverter 121, two AND gates 122 and 123 and an OR gate 124. Similarly, impedance control circuit 120' comprises an inverter 121', two AND gates 122' and 123' and an OR gate 124'. As a result of the transmission of logic zero signals by inverters 151 and OR gate 152, OR gate 124 transmits a logic signal having the same logic value as a logic signal transmitted by circuit 110 on conductor 112. The output terminal of OR gate 124 is connected to the C input terminals of transmitters 101-1, 101-2, 101-3, and 101-4. Therefore, in the NORMAL mode circuit 110 directly controls the impedance state of transmitters 101-1, 101-2, 101-3, and 101-4 with the logic signal transmitted on conductor 112. Similarly, in the NORMAL mode circuit 110 also directly controls the impedance state of receivers 102-1, 102-2, 102-3, and 102-4 with the logic signal transmitted on conductor 111. The logic zero signal received at terminal CA0 in the NORMAL mode also results in a logic zero signal being transmitted by relay driver 153 to relay input circuit 180. Accordingly, normally-closed relay contacts 181 and 182 remain closed.

Bus diagnostic unit 300 establishes the DIAGNOSTIC mode of system operation by transmitting logic zero signals to circuit pack input terminals CA0 through CAN and CB0 through CBN. In circuit pack 100-0 (FIGS. 2 and 3 arranged in accordance with FIG. 5), the logic zero signals received at terminals CA0 and CB0 result in the transmission of logic one signals by inverter 151 and OR gate 152 of control circuit 150 to impedance control circuits 120 and 120'. In response to the transmission of logic one signals by inverter 151 and OR gate 152, OR gates 124 and 124' transmit logic one signals, regardless of the logic signals transmitted by circuit 110 on conductors 111 and 112, to place transmitters 101-1, 101-2, 101-3 and 101-4 and receivers 102-1, 102-2, 102-3 and 102-4 in their high impedance state.

To determine whether circuit pack 100-0 is the source of the bus fault condition, bus diagnostic unit 300 changes the signal applied to terminal CA0 from a logic zero to a logic one, and, in response thereto, relay driver 153 transmits a logic one signal to relay input circuit 180. Accordingly, normally-closed relay contacts 181 and 182 are opened such that resistors 184 and 183 can sense current flow between BVCC and VCC and between BGND and GND, respectively. Also in response to the logic one signal at terminal CA0, a monostable multivibrator 158 transmits a pulse to reset a flip-flop 191, which is used as described later herein to store error signals. Bus diagnostic unit 300 then transmits first a logic zero signal and then a logic one signal on all four conductors of bus 500. Recall that if there is a low impedance path on circuit pack 100-0 between bus 500 and BGND, current flow through resistor 183 will exceed a predetermined magnitude when bus diagnostic unit 300 transmits the logic one signal on bus 500. Similarly, if there is a low impedance path on circuit pack 100-0 between bus 500 and BVCC, current flow through resistor 184 will exceed a predetermined magnitude when bus diagnostic unit 300 transmits a logic zero signal on bus 500. When the current flow through resistor 183 exceeds the predetermined magnitude, a comparator 188 transmits a logic one signal, referred to as a first error signal, to an input terminal of an OR gate 190. Similarly, when the current flow through resistor 184 exceeds the predetermined magnitude, a comparator 189 transmits a logic one signal, referred to as a second error signal, to the other input terminal of OR gate 190. In either case of excessive current, OR gate 190 transmits a logic one signal, referred to a composite error signal to set flip-flop 191.

Eight National Semiconductor MM70C95 tri-state devices collectively draw a maximum current of 15 microamperes from power supply 200 when they are in the high impedance state. Accordingly, when no low impedance path exists between bus 500 and BGND or BVCC on circuit pack 100-0, the current flow through resistors 183 and 184 is at most 5 microamperes. The comparison of the currents through resistors 184 and 183 with the predetermined magnitude is implemented in this embodiment by comparing the voltages developed across those resistors 184 and 183 with voltages developed across resistors 187 and 185, respectively, each having a fixed magnitude of current flowing therein. In accordance with the present example, the voltage of VCC and the resistance values of resistors 183, 184, 185, 186 and 187 are selected as shown in Table 1 such that comparator 188 generates a logic one signal when the current flow through resistor 183 exceeds 500 microamperes and similarly comparator 189 generates a logic one signal when the current flow through resistor 184 exceeds 500 microamperes.

TABLE 1

| VCC = + 5 volts |
|---|
| Resistor 183 = 5 ohms |
| Resistor 184 = 5 ohms |
| Resistor 185 = 5 ohms |
| Resistor 187 = 5 ohms |
| Resistor 186 = 9990 ohms |

Recall that flip-flop 191 was reset by a pulse from monostable multivibrator 158 when the signal at terminal CA0 was changed by bus diagnostic unit 300 from logic zero to logic one. When set by the logic one composite error signal transmitted by OR gate 190, flip-flop 191 transmits a logic one signal from its Q terminal to an open-collector OR gate 194 and a logic zero signal from its $\overline{Q}$ terminal to an open-collector OR gate 193. The logic one signal present at terminal CA0 is inverted by an inverter 192, and the resulting logic zero signal is transmitted to the other input terminals of OR gates 194 and 193. Accordingly, OR gate 194 transmits a logic one signal on reply bus 250 via terminal RA0 and OR gate 193 transmits a logic zero signal on reply bus 250 via terminal RB0, these signals indicating to bus diagnostic unit 300 that circuit pack 100-0 is the source of the bus fault condition. However, if there is no low impedance path fault on circuit pack 100-0, flip-flop 191 is not set and logic zero and logic one signals are transmitted by OR gates 194 and 193, respectively, indicating to bus diagnostic unit 300 via reply bus 250 that circuit pack 100-0 is not the source of the bus fault condition. The process is then repeated for circuit packs 100-1 through 100-N until the source of the bus fault condition is located. When fault indicator circuit 195 is operating properly, the signals transmitted at terminals RA0 and RB0 are not equal. Therefore, the transmission of equal signals at terminals RA0 and RB0 indicates to bus diagnostic unit 300 that fault indicator circuit 195 is not operating properly.

Bus diagnostic unit 300 establishes the CURRENT SENSE TEST mode of system operation to test the fault location circuitry of circuit pack 100-0 by transmitting logic one signals to terminals CA0 and CB0 on pack 100-0 and logic zero signals to terminals CA1 through CAN and CB1 through CBN on packs 100-1 through 100-N. The logic zero signals transmitted to circuit packs 100-1 through 100-N place the transmitters and receivers of those packs in the high impedance state. In circuit pack 100-0, the logic one signals received at terminals CA0 and CB0 result in the transmission of a logic zero signal by inverter 151 and a logic one signal by OR gate 152. Accordingly, OR gates 124 and 124' transmit logic zero signals to the C terminals of transmitters 101-1, 101-2, 101-3 and 101-4 and receivers 102-1, 102-2, 102-3, and 102-4 to place those devices in a low impedance state. As in the DIAGNOSTIC mode, the presence of the logic one signal at terminal CA0 results in relay contacts 181 and 182 being opened. Since receivers 102-1, 102-2, 102-3 and 102-4 are in a low impedance state, the current flow through resistors 183 and 184 exceeds the predetermined magnitude and flip-flop 191 is set. Consequently, OR gate 194 transmits a logic one signal on reply bus 250 via terminal RA0 and OR gate 193 transmits a logic zero signal on reply bus 250 via terminal RB0. Any other response on reply bus 250 indicates to bus diagnostic unit 300 that the fault location circuitry on circuit pack 100-0 is not operating properly. If one of the circuit packs 100-0 through 100-N included only transmitters, bus diagnostic unit 300 could transmit first a logic one signal and then a logic zero signal on bus 500 to force a conflict between logic signals transmitted by circuit 110 and the signals on bus 500 such that more than the predetermined magnitude of current is drawn by the transmitters on that pack.

It is to be understood that the above-described embodiment is merely illustrative of the principles of the invention and that other embodiments may be devised by those skilled in the art without departing from the spirit and scope of the invention. For example, the present invention can be incorporated in a system where the devices connected to a bus are tri-state TTL circuits if the current drawn by only the output transistors of those circuits can be sensed. Further, the devices connected to the bus could be open-collector transistors rather than tri-state circuits.

What is claimed is:

1. A bus fault location arrangement comprising
    a bus,
    a plurality of devices connected to said bus,
    energizing means for energizing said plurality of devices,
    means responsive to a fault condition on said bus for generating a fault signal,
    means responsive to said fault signal for transmitting a signal to at least one of said plurality of devices to place said at least one of said plurality of devices in a high impedance state, means responsive to said fault signal for transmitting a given signal level on said bus, current sensing means for sensing current flow between said energizing means and said at least one of said plurality of devices and error signal generating means for generating an error signal when the current flow sensed by said current sensing means exceeds a predetermined magnitude.

2. A bus fault location arrangement in accordance with claim 1 further comprising means for storing said error signal.

3. A bus fault location arrangement comprising a bus, a plurality of devices each having a terminal connected to said bus, a power applying terminal and an impedance control terminal, means for interconnecting the power applying terminals of said plurality of devices, energizing means for energizing said plurality of devices, means responsive to a fault condition on said bus for generating a fault signal, means responsive to said fault signal for transmitting a signal to the impedance control terminal of each of said plurality of devices to place each of said plurality of devices in a high impedance state, means responsive to said fault signal for transmitting a first signal level on said bus, current sensing means for sensing current flow between said energizing means and said interconnected power applying terminals of said plurality of devices and error signal generating means for generating an error signal when the current flow sensed by said current sensing means exceeds a predetermined magnitude.

4. A bus fault location arrangement in accordance with claim 3 further comprising means for storing said error signal.

5. A bus fault location arrangement in accordance with claim 3 wherein said current sensing means comprises resistor means connected between said energizing means and said interconnected power applying terminals of said plurality of devices and wherein said bus fault location arrangement further comprises means connected in parallel with said resistor means for shorting across said resistor means.

6. A bus fault location arrangement comprising a bus, a plurality of devices each having a terminal connected to said bus, first and second power applying terminals and an impedance control terminal, means for interconnecting the first power applying terminals of said plurality of devices, means for interconnecting the second power applying terminals of said plurality of devices, energizing means for energizing said plurality of devices, means responsive to a fault condition on said bus for generating a fault signal, means responsive to said fault signal for transmitting a signal to the impedance control terminal of each of said plurality of devices to place each of said plurality of devices in a high impedance state, means responsive to said fault signal for alternatively transmitting first and second signal levels on said bus, first current sensing means for sensing current flow between said energizing means and said interconnected first power applying terminals of said plurality of devices, first error signal generating means for generating a first error signal when the current flow sensed by said first current sensing means exceeds a first predetermined magnitude, second current sensing means for sensing current flow between said energizing means and said interconnected second power applying terminals of said plurality of devices and second error signal generating means for generating a second error signal when the current flow sensed by said second current sensing means exceeds a second predetermined magnitude, wherein said first and second predetermined magnitudes may be equal.

7. A bus fault location arrangement in accordance with claim 6 further comprising gate means for generating a composite error signal when said first error signal generating means generates said first error signal and for generating said composite error signal when said second error signal generating means generates said second error signal.

8. A bus fault location arrangement in accordance with claim 7 further comprising means for storing said composite error signal.

9. A bus fault location arrangement in accordance with claim 6 wherein said first current sensing means comprises first resistor means connected between said energizing means and said interconnected first power applying terminals of said plurality of devices, wherein said second current sensing means comprises second resistor means connected between said energizing means and said interconnected second power applying terminals of said plurality of devices and wherein said bus fault location arrangement further comprises means connected in parallel with said first resistor means for shorting across said first resistor means and means connected in parallel with said second resistor means for shorting across said second resistor means.

10. A bus fault location arrangement in accordance with claims, 1, 3, or 6 wherein each of said plurality of devices is a tri-state device.

11. A method for locating the source of a fault condition on a bus connecting a plurality of devices energized by a power supply, said method comprising generating a fault signal in response to said fault condition, transmitting, in response to said fault signal, a signal to at least one of said plurality of devices to place said at least one of said plurality of devices in a high impedance state, transmitting, in response to said fault signal, a given signal level on said bus, sensing current flow between said power supply and said at least one of said plurality of devices and generating an error signal when said sensed current flow exceeds a predetermined magnitude.

12. A method of determining whether a given one of a plurality of devices connected to a bus and energized by a power supply is faulty, when said bus is locked at a first voltage level, said method comprising the following steps:

connecting said bus to a voltage source at a second voltage level, sensing current flow between said power supply and said given device and generating an error signal when said current flow between said power supply and said given device exceeds a predetermined magnitude.

13. A method in accordance with claim 12 further comprising the steps of generating, prior to said connecting step, a fault signal when said bus is locked at said first voltage level and transmitting, in response to said fault signal, a signal to each of said plurality of devices to attempt to place each of said plurality of devices in a high impedance state.

14. A bus fault location arrangement comprising
a bus,
a plurality of devices connected to said bus,
energizing means for energizing said plurality of devices,
source means for generating a given voltage level,
means responsive to a fault condition wherein said bus is locked at a voltage level other than said given voltage level, for generating a fault signal,
means responsive to said fault signal for connecting said source means to said bus,
a plurality of current sensing means each associated with at least one of said plurality of devices for sensing current flow between said energizing means and the associated at least one of said devices and
error signal generating means for generating an error signal when the current flow sensed by one of said current sensing means exceeds a predetermined magnitude.

15. A bus fault location arrangement in accordance with claim 14 further comprising
means responsive to said fault signal for transmitting signals to attempt to place each of said plurality of devices in a high impedance state.

* * * * *